United States Patent [19]

Sauermann et al.

[11] 3,906,539

[45] Sept. 16, 1975

[54] CAPACITANCE DIODE HAVING A LARGE CAPACITANCE RATIO

[75] Inventors: Heinz Sauermann, Hamburg; Gerhard Winkler, Schenefeld, both of Germany

[73] Assignee: U.S. Philips Corporation, New York, N.Y.

[22] Filed: Feb. 7, 1974

[21] Appl. No.: 440,598

Related U.S. Application Data

[63] Continuation of Ser. No. 291,371, Sept. 22, 1972, abandoned.

[52] U.S. Cl. ...................... 357/14; 357/23; 357/52; 357/53; 357/54; 357/58; 357/68; 357/91

[51] Int. Cl.² ....................................... H01L 29/92

[58] Field of Search ............... 317/234 UA, 234 AZ; 357/14, 22, 52, 53, 54, 58, 68, 91, 23

[56] References Cited

UNITED STATES PATENTS

| | | | |
|---|---|---|---|
| 3,463,977 | 8/1969 | Grove et al. | 317/235 |
| 3,531,696 | 9/1970 | Haneta et al. | 317/234 |
| 3,586,925 | 6/1971 | Collard | 317/234 |
| 3,617,398 | 11/1971 | Bilous et al. | 148/175 |
| 3,656,031 | 4/1972 | Bresge et al. | 317/235 |

*Primary Examiner*—Andrew J. James
*Assistant Examiner*—Joseph E. Clawson, Jr.
*Attorney, Agent, or Firm*—Frank R. Trifari; Leon Nigohosian

[57] ABSTRACT

A capacitance diode having a large capacitance ratio comprises a semiconductor body including a p-n junction formed by a first zone of a first conductivity type and a second zone of a second conductivity type, the second zone being entirely surrounded in the semiconductor body fy the first zone and the first and second zones adjoining the surface of the semiconductor body. A highly doped channel-interrupting zone of the first conductivity type adjoining the surface, surrounds the second zone and is separated from the second zone by the first zone. An insulating layer is provided on the semiconductor body surface at least between the channel-interrupting zone and the second zone and an inversion layer extends between the second zone and the channel-interrupting zone. A field electrode which has no connection conductor and partly covers the insulating layer, is connected to the channel-interrupting zone.

17 Claims, 7 Drawing Figures

CAPACITANCE DIODE HAVING A LARGE CAPACITANCE RATIO

This is a continuation, of application Ser. No. 291,371, filed Sept. 22, 1972 now abandoned.

The invention relates to a capacitance diode having a large capacitance ratio comprising a semiconductor body in which the capacitance results from the parallel arrangement of the capacitance of a junction layer and of a capacitance between the semiconductor body and an electrode separated from the semiconductor body by an insulating layer, the semiconductor body comprising a first zone of a first conductivity type which is provided with a first connection electrode and adjoins a substantially flat surface, and a second zone of a second conductivity type which likewise adjoins said surface, is entirely surrounded in the semiconductor body by the first zone, forms a p-n junction with the first zone and comprises a second connection electrode.

Semiconductor elements having a voltage-dependent capacitance are already known which show a p-n junction in the semiconductor body. The space charge zone of said p-n junction constitutes a voltage-dependent capacitance the value of which is expressed by the known plate capacitor relationship:

$$C_R(U_R)'' \frac{\epsilon_O \cdot \epsilon H_1 F_d}{d_r(\rho, U_R)}$$

in which $C_R$ = the capacitance of the space charge zone $U_R$ = the voltage at the space charge zone $\epsilon_o = 0,8855 \cdot 10^{-13}$ Farad/cm $\epsilon H_1$ = dielectric constant of the semiconductor material $F_D$ = area of the diffused diode $d_R$ = thickness of the space charge zone.

Moreover, capacitance diodes are already known which consist of a semiconductor body on one side of which an insulating layer, for example an oxide layer, is provided on which an electrode, usually a metal electrode, is present, while on the side of the semiconductor body opposite to the insulating layer a second metal electrode is provided. When a voltage is applied between the two electrodes, the element operates as a voltage-dependent capacitance, in which the capacitance value depends upon the thickness of the insulating layer, upon the doping of the semiconductor body and upon the value of the applied voltage, and is constructed from the series arrangement of the constant capacitance of the insulating layer and of the variable capacitance in the semiconductor body.

The capacitance of the insulating layer may be expressed by the following equation analogous to the plate capacitor relationship:

$$C_I = \frac{\epsilon_O \cdot \epsilon_I \cdot F_M}{d_I}$$

in which:

$C_I$ = the capacitance of the insulating layer $\epsilon_o$ = dielectric constant of the vacuum = $0.8855 \cdot 10^{-13}$ Farad/cm $\epsilon_I$ = dielectric constant of the insulating layer $F_M$ = area of the metal electrode $d_I$ = thickness of the insulating layer. The capacitance in the semiconductor body which consists, for example, of p-type silicon varies with the applied voltage. With a high negative voltage at the metal electrode on the insulating layer, substantially only the capacitance of the insulating layer is measured because an enhancement layer of holes is formed at the interface between the semiconductor body and the insulating layer; when the negative voltage is reduced, the concentration of holes is gradually reduced and finally a depletion layer is formed. The zone depleted in charge carriers behaves as an extra dielectric. As a result of this the total capacitance is reduced. The curve passes through a minimum and increases again in the positive voltage range. The increase is the result of the formation of an inversion layer which comprises electrons. The capacitance of said inversion layer may also be expressed by an equation analogous to the plate capacitor relationship:

$$C_{In}(U_R) = \frac{\epsilon_O \cdot \epsilon H I F_{In}(U_R)}{d_{In}(\rho, U_R \cdot Q_I)},$$

in which $C_{In}$ = the capacitance of the inversion layer $\epsilon_{H1}$ = dielectric constant of the semiconductor material $F_{In}$ = area of the inversion layer dependent upon the voltage at the space charge zone $d_{In}$ = thickness of the inversion layer dependent upon the resistivity $\rho$, upon the voltage at the space charge zone $U_R$ and upon the charge of the insulating layer $Q_I$.

Various attempts have been made to increase the capacitance ratio of semiconductor elements which controllable capacitance by combination effects.

It is known, for example, in semiconductor devices having several p-n junctions which are to be used as voltage-dependent capacitances, to increase the separate voltage-dependent capacitances of the space charge zones of the semiconductor junctions by controlling the conductivity of the part of the semiconductor body present between the zones of the opposite conductivity type by parallel arrangement.

It is furthermore known to increase the capacitance ratio of capacitance diodes by forming a p-n junction which is variable in value by means of an inversion zone.

An important drawback of said elements is that they are to be constructed as three-terminal elements so that an extra auxiliary or control electrode is necessary for said elements.

One of the objects of the invention is to provide a capacitance diode having a large capacitance ratio with a characteristic adapted to the requirements which does not exhibit this drawback and is constructed as a two-terminal diode.

The invention is furthermore based on the recognition of the fact that it is possible by a special parallel arrangement of the capacitances of the space charge zone of a p-n junction, of an insulating layer and of an inversion layer, to manufacture an element having a very large capacitance ratio, without this requiring an extra auxiliary or control electrode.

Therefore, a capacitance diode of the type described in the preamble is characterized according to the invention in that a channel-interrupting according to the invention in that a channel-interrupting zone of the first conductivity type adjoining the surface surrounds the second zone, is separated from the second zone by the first zone and has a higher doping than the first zone, that an insulating layer is provided on the surface at least between the channel-interrupting zone and the second zone and that, in order to influence an inversion layer adjoining the second zone and formed in a surface layer extending from the second zone to the channel-interrupting zone, a field electrode without connection conductor is present which partly covers the insulating layer and is connected to the channel-interrupting zone.

The advantages resulting from the use of the invention are in particular that the element according to the invention requires no separate control electrode and nevertheless has a large capacitance ratio, while the characteristic of the element can be readily adapted to the requirements.

The capacitance diode according to the invention can be realized in a particularly simple manner by means of the planar technique.

In order to obtain an inversion layer capacitance, corresponding manufacturing steps are to be carried out. According to preferred embodiments of the invention this is carried out by the formation of a surface layer which promotes the inversion and which is obtained by out-diffusion of a doping material from the first zone or by epitaxy and which comprises a concentration of acceptor and donor atoms substantially compensating each other or a concentration of ions implanted by ion bombardment.

In order to obtain an excess of positive charge, according to a further preferred embodiment of the invention fixed positive charges are built-in, by means of the ion implantation technique, in the insulating layer adjoining the semiconductor surface, which insulating layer may be covered by a further stabilizing insulating layer, for example, a pyrolytic oxide layer of high positive charge with a great stability.

In order to ensure a long life, the element according to a further embodiment of the invention is covered by a further insulating layer, for example, a nitride layer, as a protective layer against surface influences.

According to further embodiments of the invention, the following measures are taken to control the value for the capacitance minimum with given values for the capacitance maximum:

1. Both the field electrode and the second connection electrode may be given a configuration which is adapted to the requirements, for example, a comb-shaped or spiral-like geometry.

2. The second connection electrode may be constructed as a double metallization with the interposition of an insulating layer in the form of an "overlay" contact (above or below the field electrode). When using the "overlay" technique, an insulating layer of nitride may be used.

The invention will now be described in greater detail with reference to the accompanying drawing, in which:

FIG. 1 is a cross-sectional view of a capacitance diode according to the invention, FIG. 2 is a plan view of the said capacitance diode, FIG. 3 is a plan view of said capacitance diode with a field electrode of comb-shaped geometry, FIG. 4 is a plan view of said capacitance diode with the field electrode in comb-shaped geometry and with the second connection electrode, likewise in comb-shaped geometry, present in the vicinity of the field electrode, FIG. 5 is a diagrammatic cross-sectional view of the capacitance diode taken on the line V—V of FIG. 4, FIG. 6 shows the simplified electric equivalent circuit diagram for the parallel arrangement of the three capacitances of the diode, FIG. 7 shows the voltage-capacitance variation of a capacitance diode according to the invention and of a normal junction capacitance diode.

Starting material in the manufacture of the diode shown in FIG. 1 is a boron-doped p-type silicon semiconductor body 1. When the insulating layer 2 on the semiconductor body 1 adjoining the semiconductor surface should consist of an oxide layer, said layer is formed, for example, by thermal oxidation in an atmosphere of moist oxygen at temperatures of over 1100°C.

During said thermal oxidation, a high-ohmic surface layer 3 promoting the inversion is formed by out-diffusion of boron in the $SiO_2$. With this process an endeavoured depletion of the p-type silicon at the surface is produced.

The oxide layer 2 formed by thermal oxidation may have a thickness of approximately 0.4 $\mu$m. In higher conductivity p-type silicon, the oxidation process may be repeated to contribute to the formation of the surface layer 3 promoting the inversion.

The formation of the high-ohmic surface layer 3 permitting the inversion need not take place by single or multiple out-diffusion of boron but may also be achieved by directed compensation diffusion from an n-doping source or by means of the ion implanation technique by building-in donor atoms, or by epitaxy.

In the insulating layer 2 adjoining the semiconductor surface, further positive fixed charges may be built-in by means of the ion implantation technique.

After oxidation, the semiconductor plate is provided with a photomask which does not cover the region of the channel-interrupting zone 5; the channel-interrupting zone 5 is formed by means of a highly doped boron diffusion. The next manufacturing step is the covering of the plate with a stabilizing insulating layer 6 of high positive voltage, for example, by means of the "sputter" technique, so as to obtain an excess of positive charge and hence to promote the formation of the channel zone. The plate is again subjected to a photo-etching step (photomasking and subsequent etching process) for opening the diffusion window for the second zone of the second conductivity type 7 to be formed (for this embodiment the n-zone). The diffusion of the n-doping may take place from a $POCl_3$ source at approximately 1100°C. By a repeated photo-etching step, windows are exposed above the channel-interrupting zone 5 and above the n-type zone 7. In order to hermetically seal the elements from atmospheric influences, the plate is covered with a further insulating layer 8, in this embodiment with a nitride layer. A further photo-etching step produces the re-opening of the windows above the n-type zone 7 and above the channel-interrupting zone 5 for the metallization of the second connection electrode 9 and for the metallization of the field electrode 10, which field electrode extends via the nitride layer 8 to in the channel-interrupting zone 5 and is at the potential of the first connection electrode on the p-type zone 1 of the semiconductor body.

The following numbers are mentioned to illustrate the proportions of the element:

The area of the crystal chip is, for example, 1200 × 1200 $\mu m^2$ and the surface of the metallization of the second connection electrode 9 without comb-shaped geometry (compare FIG. 2) is 300 × 300 $\mu m^2$. The size of the metallization of the field electrode 10 depends on the desired profile variation of the diode; said metallization may be chosen to be so small as to just comprise the region of the channel-interrupting zone 5; however, said metallization may also occupy the overall crystal surface reduced by the surface of the diffused diode. The thickness of the oxide layer 6 plus that of the nitride layer 8 may be between 0.2 and 2 $\mu m$, while the thickness of the metallization layers 9 and 10 may be between 0.6 and 1.2 $\mu m$.

The variation of the characteristic of the element according to the invention can be influenced via the configuration of both the second connection electrode 9 and of the field electrode 10.

When the p-n junction is cut off, the field electrode 10 which has a polarity opposite to that of the second connection electrode 9 draws positive mobile charges on the insulating layer 2 adjoining the semiconductor surface. The effect is a reduction of the inversion layer below the field electrode 10.

This effect can be partly counteracted by, for example, a comb-shaped or spiral-shaped geometry of the metallization of the second connection electrode 9, the teeth or spiral turns of the second connection electrode 9 extending in the intermediate spaces between the teeth or spiral turns of the field electrode metallization 10.

FIG. 2 is a plan view of an element according to the invention with the second connection electrode 9, the nitride layer 8 and the field electrode 10. Aluminium is preferably used as an electrode material.

$C_1 = C_{insulation\ layer}$ $C_2 = C_{inversion\ layer}$ $C_3 = C_{junction\ layer}$.

Figures 1, 2:
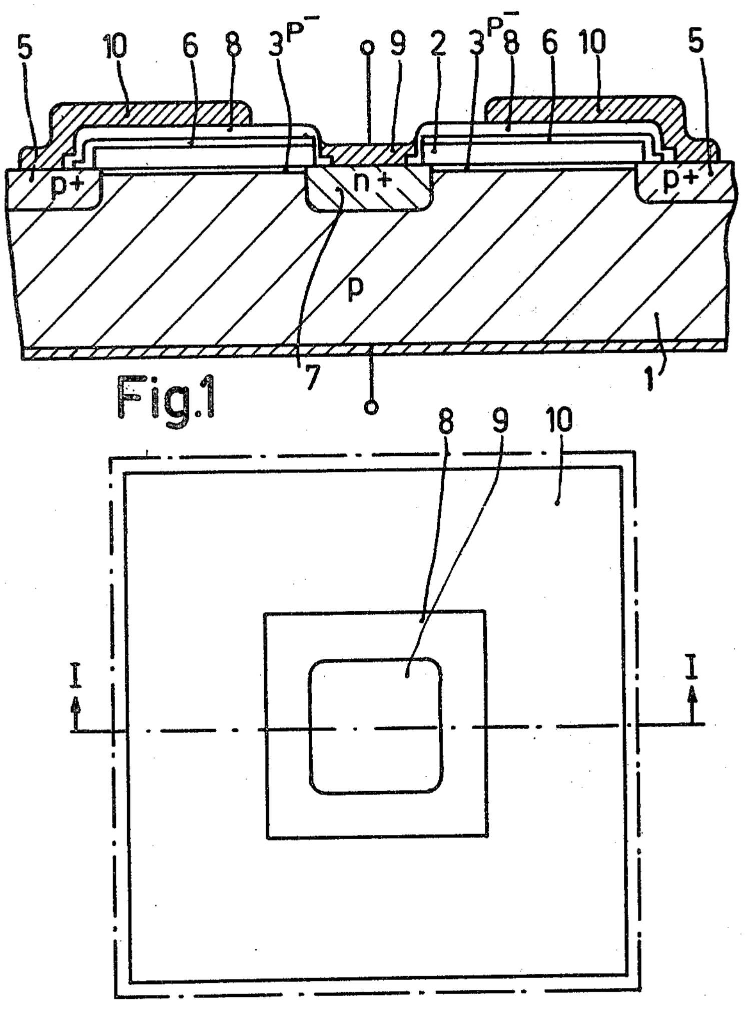
Figure 3:
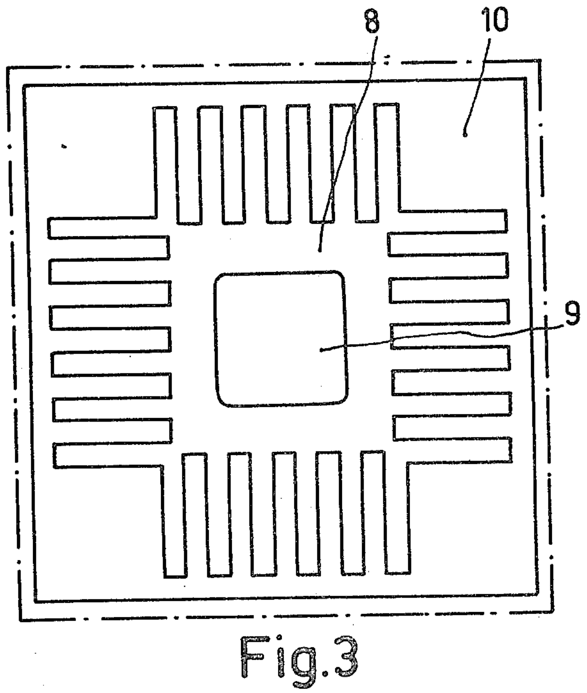
FIG. 3 is a plan view of an element according to the invention in which the field electrode 10 is given a comb-shaped geometry.
Figure 6:
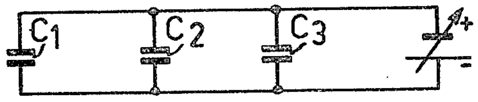
FIG. 6 shows the simplified electric equivalent circuit diagram of the parallel arrangement of the three capacitances.
Figure 4:
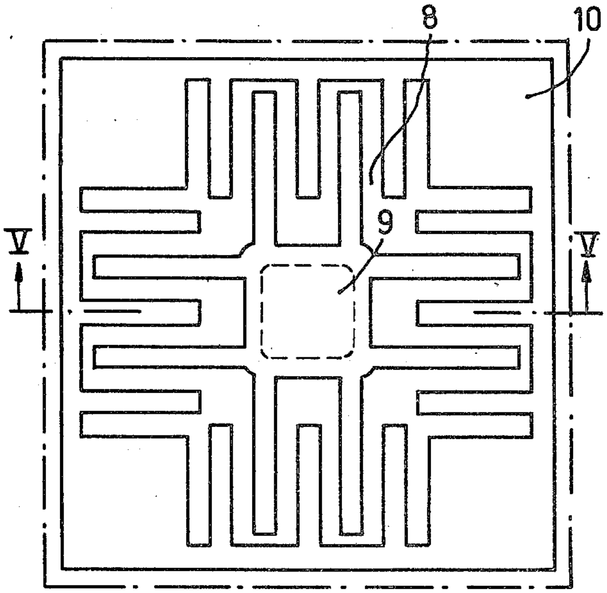
FIG. 4 is a plan view of an element according to the invention in which both the field electrode 10 and the second connection electrode 9 are given a comb-shaped geometry. The two comb-shaped electrodes inter-digitate.
Figure 5:
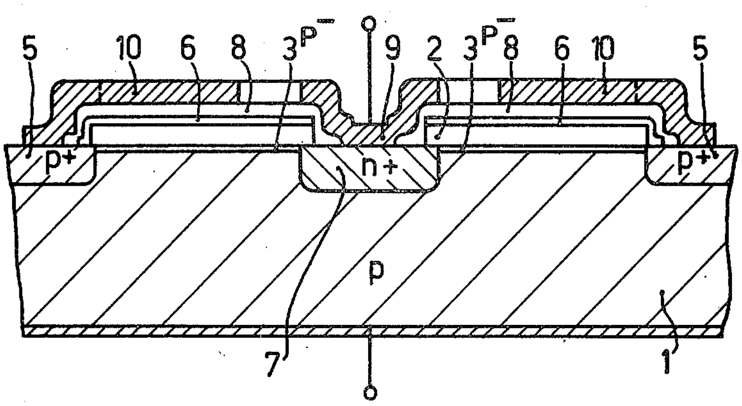
FIG. 5 is a sectional view of the element according to the invention taken on the line V—V of FIG. 4.
Figure 7:
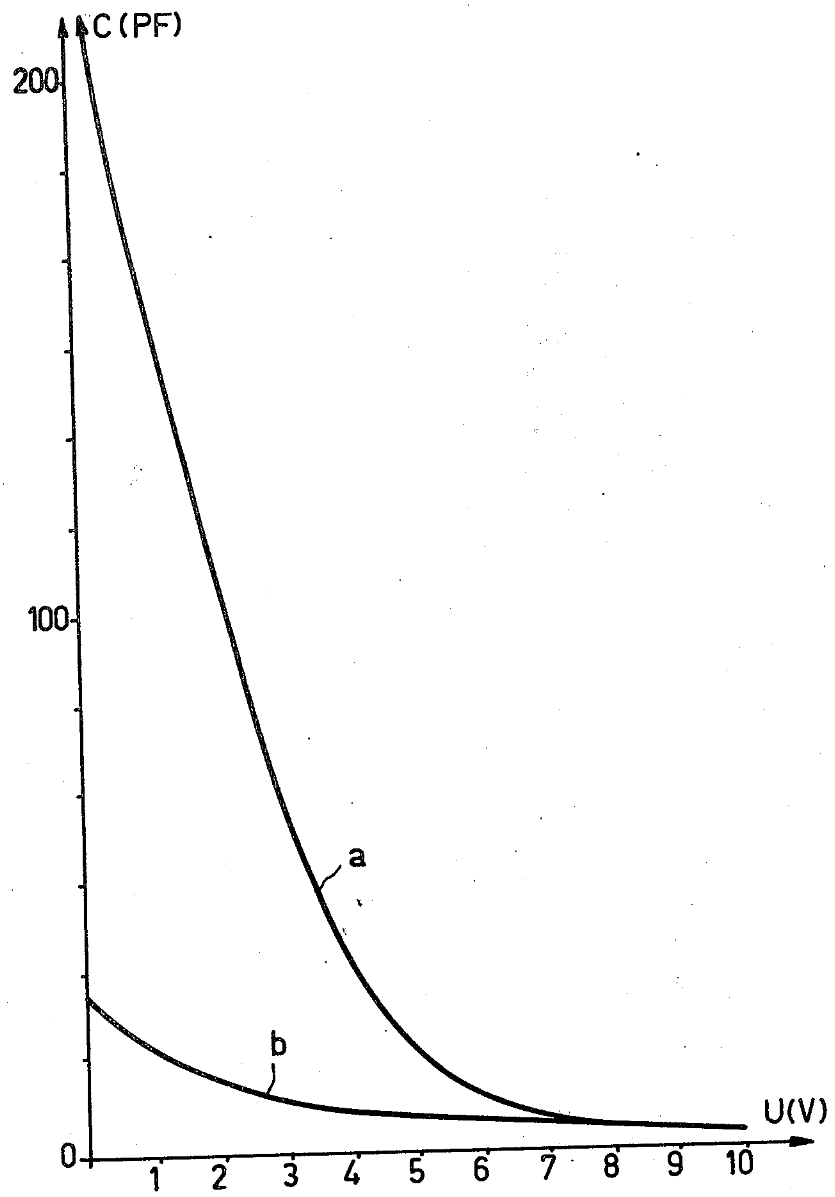

FIG. 7 shows the voltage-capacity variation of a capacitance diode according to the invention (a) and the voltage-capacity variation of a normal p-n junction capacitance diode of a corresponding value (b). The variation of the characteristic (a) which is much steeper as compared with the characteristic (b) is to be ascribed to the parallel arrangement of the three capacitances combined in the element according to the invention.

It is to be noted that the invention is not restricted to the above-described examples but that many variations are possible to those skilled in the art without departing from the scope of this invention. For example, in particular semiconductor materials other than silicon, for example, germanium or III–V semiconductor compounds, may be used. Other insulating materials may also be used. Furthermore, the electrodes and the field electrode, respectively, may consist of preferably doped semiconductor material, for example, polycrystalline silicon, instead of metal, while in the examples all the conductivity types may be replaced by their opposite conductivity types.

What is claimed is:

1. A capacitance diode characterized by a large capacitance ratio, comprising:

a. a semiconductor body having a first major surface and comprising a first zone of first conductivity type disposed at said first surface;

b. a second zone of second opposite conductivity type located in said body at said first surface, said second zone being completely surrounded in said body by said first zone and forming a p, n junction with said first zone;

c. first and second connection electrodes contacting said first and second zones respectively, said second electrode contacting said body at only said second zone;

d. a channel-interrupting third zone of said first conductivity type located in said body at said first surface and surrounding said second zone, said second and third zones being spaced apart by portions of said first zone, said third zone having a higher doping impurity level than said first zone;

e. a surface layer disposed at said first surface between said second and third zones, said surface layer having a resistivity significantly higher than that of said first zone and having a net dopant concentration of said first conductivity type;

f. an electrically insulating first layer disposed on said first surface and covering at least the portion of said first surface located between said second and third zones; and g. a field electrode disposed over a portion of said first layer, said field electrode extending to and being in electrical connection with said third zone, such that said field electrode is at a floating potential, whereby there can be formed in said surface layer an inversion layer extending from said second zone to said second zone to said third zone.

2. A capacitance diode as in claim 1, comprising only a single said field electrode.

3. A capacitance diode as claimed in claim 1, wherein said semiconductor body consists essentially of silicon, said first zone is p-type conductive, and at least said insulating first layer adjoining the semiconductor surface consists essentially of silicon oxide.

4. A capacitance diode as recited in claim 2, wherein said first zone is doped with boron.

5. A capacitance diode as recited in claim 1, wherein said surface layer is a doping material out diffused surface portion of said first zone.

6. A capacitance diode as recited in claim 1, wherein said surface layer is an epitaxial layer.

7. A capacitance diode as recited in claim 1, wherein said first conductivity type surface layer is partially compensated and comprises respective concentrations of acceptor and donor atoms.

8. A capacitance diode as recited in claim 1, wherein said surface layer comprises a concentration of ion bombardment implated atoms.

9. A capacitance diode as recited in claim 1, wherein said insulating first layer adjoining the semiconductor surface comprises fixed ion impanted positive charges.

10. A capacitance diode as recited in claim 1, wherein said insulating layer adjoining the semiconductor surface and the channel-interrupting third zone are covered by a stabilizing insulating second layer which comprises positive charges.

11. A capacitance diode as recited in claim 10, wherein said insulating second layer consists essentially of oxide of said semiconductor material.

12. A capacitance diode as recited in claim 11, wherein said insulating second layer is a pyrolytic oxide layer.

13. A capacitance diode as recited in claim 10, wherein said insulating second layer is at least partly covered by a insulating third layer.

14. A capacitance diode as recited in claim 13, wherein said insulating third layer consists essentially of nitride of semiconductor material.

15. A capacitance diode as recited in claim 1, wherein said field electrode is comb-shaped.

16. A capacitance diode as recited in claim 15, wherein second connection electrode has a geometry which engages in the geometry of the field electrode.

17. A capacitance diode as recited in claim 16, wherein said second connection electrode has a comb-shaped geometry which is interdigitated with the comb-shaped field electrode.

* * * * *

UNITED STATES PATENT AND TRADEMARK OFFICE

CERTIFICATE OF CORRECTION

PATENT NO. : 3,906,539

DATED : September 16, 1975

INVENTOR(S) : HEINZ SAUERMANN ET AL

It is certified that error appears in the above-identified patent and that said Letters Patent are hereby corrected as shown below:

On the Title page, Section [30] inser the following section:

--[30] Foreign Appln. Priority Data

Sept. 22, 1971 W. Germany.............P.2147291.3--.

Signed and Sealed this

*eleventh* Day of *May 1976*

[SEAL]

*Attest:*

RUTH C. MASON
*Attesting Officer*

C. MARSHALL DANN
*Commissioner of Patents and Trademarks*